(12) United States Patent
Shin et al.

(10) Patent No.: US 8,958,046 B2
(45) Date of Patent: Feb. 17, 2015

(54) DISPLAY SUBSTRATE, DISPLAY PANEL HAVING THE DISPLAY SUBSTRATE, AND DISPLAY DEVICE HAVING THE DISPLAY PANEL

(71) Applicant: Samsung Display Co., Ltd., Yongin, Gyeonggi-Do (KR)

(72) Inventors: Kyoung-Ju Shin, Hwaseong-si (KR); Chong-Chul Chai, Seoul (KR)

(73) Assignee: Samsung Display Co., Ltd. (KR)

( * ) Notice: Subject to any disclaimer, the term of this patent is extended or adjusted under 35 U.S.C. 154(b) by 71 days.

(21) Appl. No.: 13/839,073

(22) Filed: Mar. 15, 2013

(65) Prior Publication Data

US 2013/0207134 A1 Aug. 15, 2013

Related U.S. Application Data (62) Division of application No. 12/505,154, filed on Jul. 17, 2009, now Pat. No. 8,432,523.

(30) Foreign Application Priority Data

Dec. 2, 2008 (KR) ........................ 10-2008-0120856

(51) Int. Cl.
G02F 1/1345 (2006.01)
H01L 27/12 (2006.01)
G02F 1/13 (2006.01)
G02F 1/1362 (2006.01)

(52) U.S. Cl.
CPC ................ *H01L 27/124* (2013.01); *G02F 1/13* (2013.01); *G02F 1/1345* (2013.01); *G02F 1/136286* (2013.01); *G02F 2201/56* (2013.01)
USPC ........................................... 349/151; 349/158

(58) Field of Classification Search
None
See application file for complete search history.

(56) References Cited

U.S. PATENT DOCUMENTS

| 5,270,693 | A | 12/1993 | Wyler et al. |
| 7,253,865 | B2 | 8/2007 | Battersby |
| 7,567,231 | B2 | 7/2009 | Takahashi et al. |
| 2008/0012794 | A1* | 1/2008 | Battersby ........................ 345/55 |
| 2008/0018557 | A1 | 1/2008 | Maeda |
| 2008/0018583 | A1 | 1/2008 | Knapp et al. |

FOREIGN PATENT DOCUMENTS

| JP | 2008065198 A | 3/2008 |
| KR | 1020070023250 A | 2/2007 |

* cited by examiner

*Primary Examiner* — Richard Kim
(74) *Attorney, Agent, or Firm* — Cantor Colburn LLP (57) ABSTRACT

A display substrate includes a base substrate, a gate line portion, a data line portion, and a pixel portion. The base substrate includes a display area divided into first to fourth divided display areas, and first to fourth peripheral areas. The gate line portion includes a plurality of first gate lines, and a plurality of second gate lines. The data line portion includes a plurality of first data lines, and a plurality of second data lines. The pixel portion is disposed in the display area to be electrically connected to the first and second gate lines and the first and second data lines, respectively.

1 Claim, 7 Drawing Sheets

DISPLAY SUBSTRATE, DISPLAY PANEL HAVING THE DISPLAY SUBSTRATE, AND DISPLAY DEVICE HAVING THE DISPLAY PANEL

CROSS REFERENCE TO RELATED APPLICATIONS

This application is a divisional of U.S. patent application Ser. No. 12/505,154, filed on Jul. 17, 2009, which claims priority to Korean Patent Application No. 2008-120856, filed on Dec. 2, 2008, and all the benefits accruing therefrom under 35 U.S.C. §119, the contents of which in its entirety are herein incorporated by reference.

BACKGROUND OF THE INVENTION

1. Field of the Invention

The present invention relates to a display substrate, a display panel having the display substrate and a display device having the display panel. More particularly, the present invention relates to a display substrate used in a liquid crystal display ("LCD") device, a display panel having the display substrate and a display device having the display panel.

2. Description of the Related Art

Generally, a liquid crystal display ("LCD") device includes an LCD panel which displays an image using a light transmissivity of liquid crystal, and a backlight assembly which applies light to the LCD panel.

The LCD panel includes a first substrate, a second substrate facing the first substrate and a liquid crystal layer interposed between the first substrate and the second substrate. The first substrate includes gate lines disposed along a first direction, data lines disposed along a second direction crossing, e.g., substantially perpendicular to, the first direction, thin-film transistors ("TFTs") electrically connected to the gate lines and the data lines, and pixel electrodes electrically connected to the TFTs. The second substrate includes color filters corresponding to the pixel electrode and a common electrode disposed on a surface of the second substrate. An arrangement of the liquid crystal layer is altered by an electric field formed between the pixel electrode and the common electrode. Thus, light transmissivity through the liquid crystal layer is varied.

Typically, the gate lines extend in the first direction to receive a gate signal from a gate driving part, and the data lines extend in the second direction crossing the first direction to receive a data signal from a data driving part. In addition, the gate driving part is disposed at a first portion of the first substrate along the first direction to be electrically connected to the gate lines, and the data driving part is disposed at a second portion of the first substrate along the second direction to be electrically connected to the data lines. Thus, the LCD panel may have a rectangular shape when viewed from a top plan view perspective.

However, due to a line arrangement between the gate lines and the data lines and the position of the gate driving part and the data driving part, it is difficult to manufacture the LCD panel having various shapes other than the rectangular shape.

BRIEF SUMMARY OF THE INVENTION

Exemplary embodiments of the present invention provide a display substrate capable of having various shapes other than a rectangular shape.

Exemplary embodiments of the present invention also provide a display panel having the display substrate.

Exemplary embodiments of the present invention also provide a display device having the display panel.

According to an exemplary embodiment of the present invention, a display substrate includes a base substrate, a gate line portion, a data line portion and a pixel portion.

The base substrate includes a first divided display area, a second divided display area, a third divided display area and a fourth divided display area that are sequentially disposed along a clockwise direction by dividing a display area into four areas for displaying an image; and a first peripheral area, a second peripheral area, a third peripheral area and a fourth peripheral area that are formed at peripheral portions of the first to fourth divided display areas, respectively. The gate line portion includes a plurality of first gate lines formed on the first and second divided display areas substantially parallel with the first direction, the first gate line being extended on the first peripheral area; and a plurality of second gate lines formed on the third and fourth dividing areas substantially parallel with the first direction, the second gate lines being extended on the third peripheral area. The data line portion includes a plurality of first data lines formed on the fourth and first divided display areas substantially parallel with the second direction, the first data line being extended on the fourth peripheral area; and a plurality of second data lines formed on the second and third divided display areas substantially parallel with the second direction, the second data lines being extended on the second peripheral area. The pixel portions are disposed in the display area in a matrix pattern. Each of the pixel portions is electrically connected to one of the first and second gate lines and one of the first and second data lines.

In an exemplary embodiment, the first gate lines may include a plurality of first gate main lines formed on the first and second divided display areas substantially parallel with the first direction, and a plurality of first gate peripheral lines formed on the first peripheral area to be connected to terminals of the first gate main lines, respectively. The second gate lines may include a plurality of second gate main lines formed on the third and fourth divided display areas substantially parallel with the first direction, and a plurality of gate peripheral lines formed on the third peripheral area to be connected to a terminal of the second gate main lines, respectively. The first data lines may include a plurality of first data main lines formed on the fourth and first divided display areas substantially parallel with the second direction, and a plurality of first data peripheral lines formed on the fourth peripheral area to be connected to a terminal of the first data main lines, respectively. The second data lines may include a plurality of second data main lines formed on the second and third divided display areas substantially parallel with the second direction, and a plurality of second data peripheral lines formed on the second peripheral area to be connected to a terminal of the second data main lines, respectively.

In an exemplary embodiment, the first gate peripheral lines may be extended in a longitudinal direction of the first peripheral area, and the second gate peripheral lines may be extended in a longitudinal direction of the third peripheral area. The first data peripheral lines may be extended in a longitudinal direction of the fourth peripheral area, and the second data peripheral lines may be extended in a longitudinal direction of the second peripheral area.

In an exemplary embodiment, all of the first and second gate peripheral lines and the first and second data peripheral lines may be extended in the same direction, which is identical to the clockwise direction or a counterclockwise direction.

Alternatively, a portion of the first gate peripheral lines may be extended in the clockwise direction, and another portion of the first gate peripheral lines may be extended in the counterclockwise direction. A portion of the second gate peripheral lines may be extended in the clockwise direction, and another portion of the second gate peripheral lines may be extended in the counterclockwise direction. A portion of the first data peripheral lines may be extended in the clockwise direction, and another portion of the first data peripheral lines may be extended in the counterclockwise direction. A portion of the second data peripheral lines may be extended in the clockwise direction, and another portion of the second data peripheral lines may be extended in the counterclockwise direction. The number of the clockwise first gate peripheral lines may be substantially equal to the number of the counterclockwise first gate peripheral lines. The number of the clockwise second gate peripheral lines may be substantially equal to the number of the counterclockwise second gate peripheral lines. The number of the clockwise first data peripheral lines may be substantially equal to the number of the counterclockwise first data peripheral lines. The number of the clockwise second data peripheral lines may be substantially equal to the number of the counterclockwise second data peripheral lines.

Alternatively, the first gate peripheral lines and the second gate peripheral lines may be extended in a direction identical to the clockwise direction or the counterclockwise direction, and the first data peripheral lines and the second data peripheral lines may be extended in a direction identical to the clockwise direction or the counterclockwise direction. The first gate peripheral lines and the first data peripheral lines may be extended in directions opposite to each other, and the second gate peripheral lines and the second data peripheral lines may be extended in directions opposite to each other.

In an exemplary embodiment, the display area may have a circular or polygonal shape. The display area may have a symmetrical shape with respect to the first and second directions. Here, all of the first to fourth peripheral areas may be extended along the peripheral portions of the display area.

In an exemplary embodiment, the base substrate may further include a first protruding area extended outwardly from the first peripheral area; a second protruding area extended outwardly from the second peripheral area; a third protruding area extended outwardly from the third peripheral area; and a fourth protruding area extended outwardly from the fourth peripheral area. Here, the first gate lines may be extended from the first peripheral area to the first protruding area, the second gate lines may be extended from the third peripheral area to the third protruding area, the first data lines may be extended from the fourth peripheral area to the fourth protruding area, and the second data lines may be extended from the second peripheral area to the second protruding area.

In an exemplary embodiment, the display substrate may further include a first gate driving part formed on the first protruding area to be electrically connected to the first gate lines, the first gate driving part applying each of first gate signals to the first gate lines; and a second gate driving part formed on the third protruding area to be electrically connected to the second gate lines, the second gate driving part applying each of second gate signals to the second gate lines.

In an exemplary embodiment, each of the pixel portions may include a thin-film transistor ("TFT") electrically connected to one of the first and second gate lines and one of the first and second data lines; and a pixel electrode electrically connected to the TFT. The pixel electrode may include an optically transparent and electrically conductive material. The first and second gate driving parts may be formed through a process substantially same as a forming process of the TFT.

In an exemplary embodiment, the display substrate may further include a first data driving part mounted on the fourth protruding area in a chip form to be electrically connected to the first data lines, the first data driving part applying the first data signals to the first data lines, respectively; and a second data driving part mounted on the second protruding area in a chip form to be electrically connected to the second data lines, the second data driving part applying the second data signals to the second data lines, respectively.

Alternatively, the display substrate may include a first integrated driving chip and a second integrated driving chip. The first integrated driving chip is electrically connected to the first gate lines and the first data lines through the first and fourth protruding areas that are connected to each other to be integrally formed. The first integrated driving chip applies the first gate signals to the first gate lines, respectively, and applies the first data signals to the first data lines, respectively. The second integrated driving chip is electrically connected to the second gate lines and the second data lines through the second and third protruding areas that are connected to each other to be integrally formed. The second integrated driving chip applies the second gate signals to the second gate lines, respectively, and applies the second data signals to the second data lines, respectively.

According to an exemplary embodiment of the present invention, a display panel includes a first substrate, a second substrate and a liquid crystal layer.

The second substrate faces the first substrate. The liquid crystal layer is interposed between the first and second substrates. The first substrate includes a base substrate, a gate line portion, a data line portion and a plurality of pixel portions. The base substrate includes a first divided display area, a second divided display area, a third divided display area and a fourth divided display area that are sequentially disposed along a clockwise direction by dividing a display area into four areas for displaying an image; and a first peripheral area, a second peripheral area, a third peripheral area and a fourth peripheral area that are formed at peripheral portions of the first to fourth divided display areas, respectively. The gate line portion includes a plurality of first gate lines formed on the first and second divided display areas substantially parallel with the first direction, the first gate line being extended on the first peripheral area; and a plurality of second gate lines formed on the third and fourth dividing areas substantially parallel with the first direction, the second gate lines being extended on the third peripheral area. The data line portion includes a plurality of first data lines formed on the fourth and first divided display areas substantially parallel with the second direction, the first data line being extended on the fourth peripheral area; and a plurality of second data lines formed on the second and third divided display areas substantially parallel with the second direction, the second data lines being extended on the second peripheral area. The pixel portions are disposed in the display area in a matrix pattern. Each of the pixel portions is electrically connected to one of the first and second gate lines and one of the first and second data lines.

According to an exemplary embodiment of the present invention, a display panel includes a display panel, a controller board and a plurality of flexible circuit films. The display panel includes a first substrate, a second substrate facing the first substrate, and a liquid crystal layer interposed between the first substrate and the second substrate. The controller board is electrically connected the display panel to control the display panel. The flexible circuit films connect to the display panel and the controller board. The first substrate includes a base substrate, a gate line portion, a data line portion and a plurality of pixel portions.

The base substrate includes a first divided display area, a second divided display area, a third divided display area and a fourth divided display area that are sequentially disposed along a clockwise direction by dividing a display area into four areas for displaying an image; and a first peripheral area, a second peripheral area, a third peripheral area and a fourth peripheral area that are formed at peripheral portions of the first to fourth divided display areas, respectively. The gate line portion includes a plurality of first gate lines formed on the first and second divided display areas substantially parallel with the first direction, the first gate line being extended on the first peripheral area; and a plurality of second gate lines formed on the third and fourth dividing areas substantially parallel with the first direction, the second gate lines being extended on the third peripheral area. The data line portion includes a plurality of first data lines formed on the fourth and first divided display areas substantially parallel with the second direction, the first data line being extended on the fourth peripheral area; and a plurality of second data lines formed on the second and third divided display areas substantially parallel with the second direction, the second data lines being extended on the second peripheral area. The pixel portions are disposed in the display area in a matrix pattern. The pixel portions are electrically connected to the first and second gate lines and the first and second data lines, respectively.

In an exemplary embodiment of the present invention, the display device may further include a backlight unit disposed below the display panel to provide the display panel with light.

The display panel may further include a first data driving part electrically connected to the first data lines, and a second data driving part electrically connected to the second data lines. The first and second data driving parts may be mounted on the flexible circuit films.

According to the example embodiments, a display area and a peripheral area are divided into four areas and gate lines or data lines are formed on each of the divided display and peripheral areas, so that a first substrate of a display panel may be manufactured in various shapes other than a rectangular shape.

BRIEF DESCRIPTION OF THE DRAWINGS

The above and other features and advantages of the present invention will become more apparent by describing in further detail exemplary embodiments thereof with reference to the accompanying drawings, in which.

DETAILED DESCRIPTION OF THE INVENTION

The present invention is described more fully hereinafter with reference to the accompanying drawings, in which exemplary embodiments of the present invention are shown. The present invention may, however, be embodied in many different forms and should not be construed as being limited to the exemplary embodiments set forth herein. Rather, these exemplary embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein are to be interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as being limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be explained in further detail with reference to the accompanying drawings.

Figure 1:
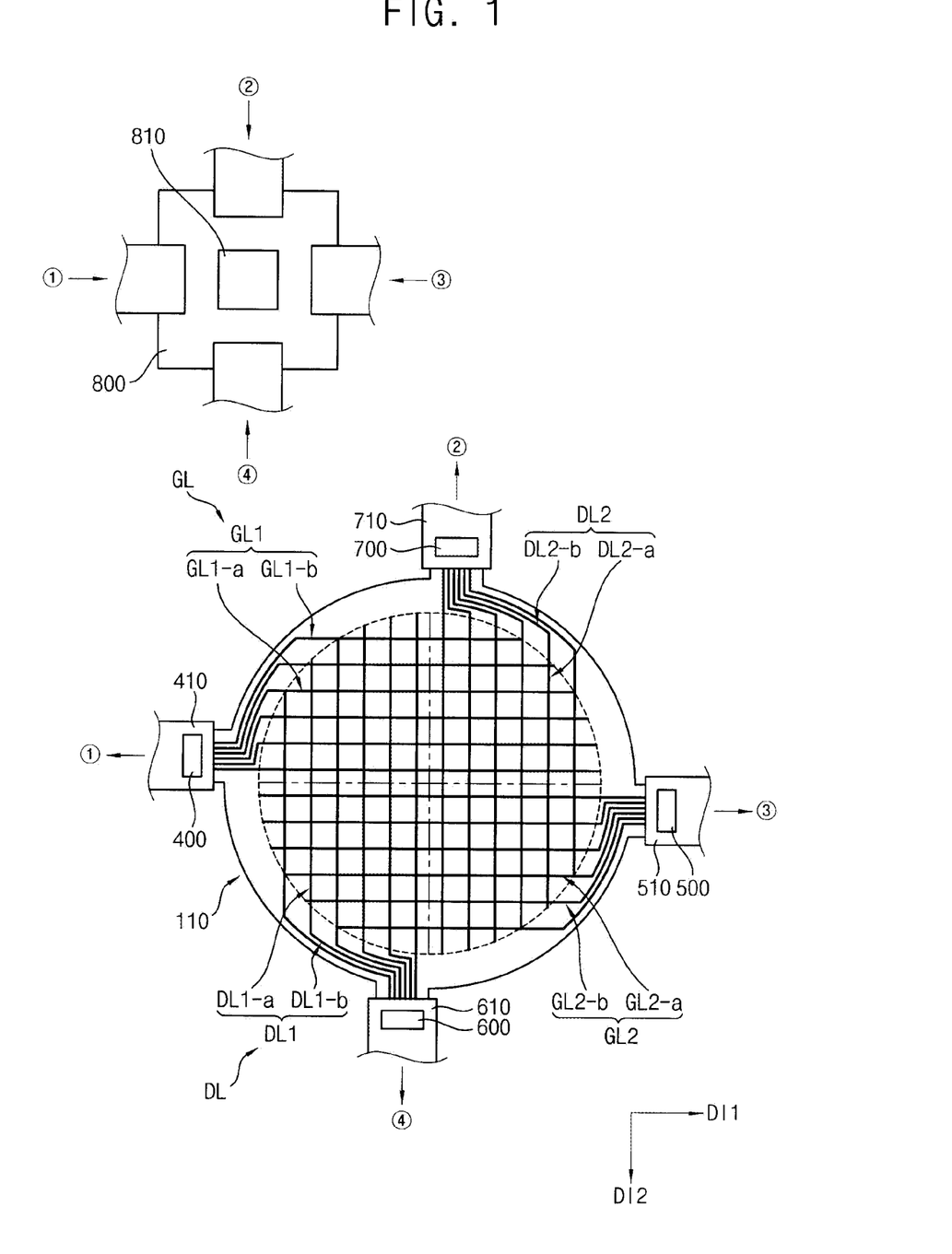
FIG. 1 is a plan view schematically illustrating an exemplary embodiment of a display device according to the present invention.
Figure 2:
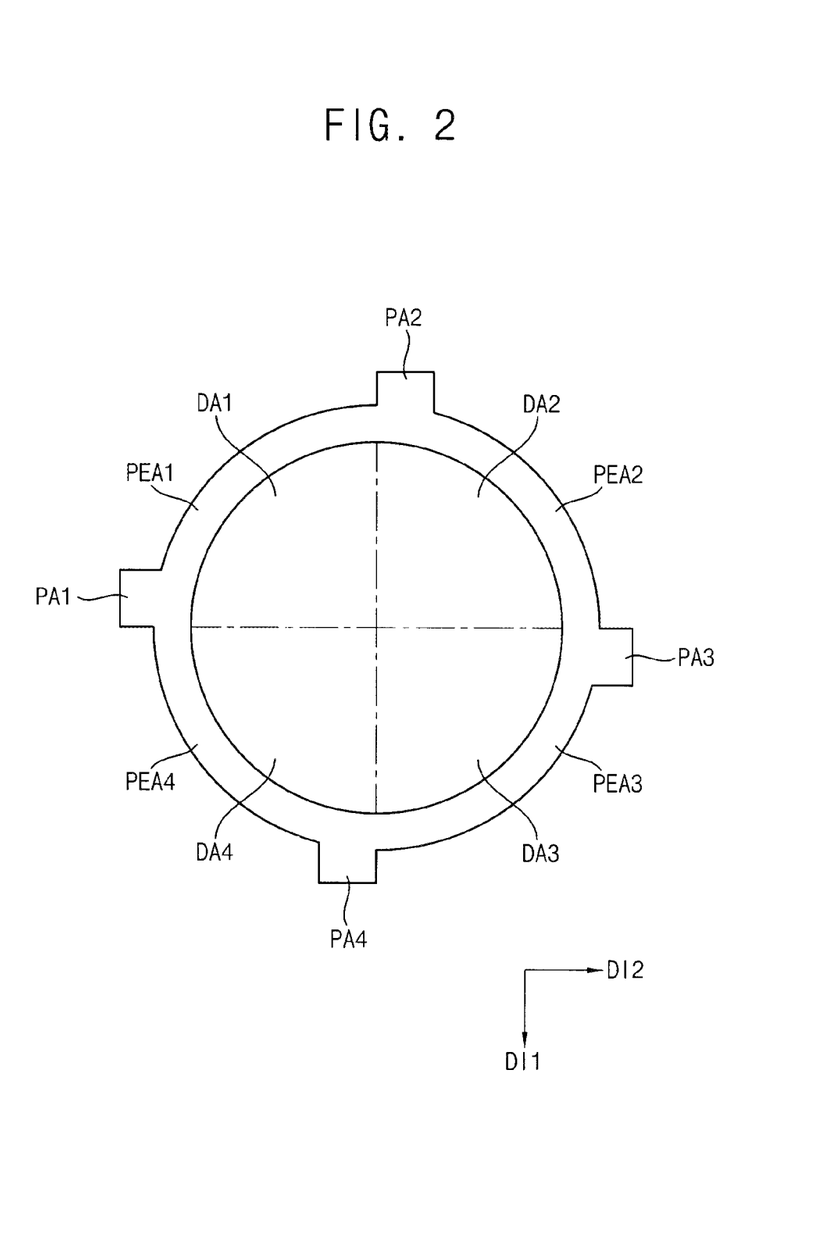
FIG. 2 is a plan view schematically illustrating areas of a first substrate of the display panel of FIG. 1.
Figure 3:
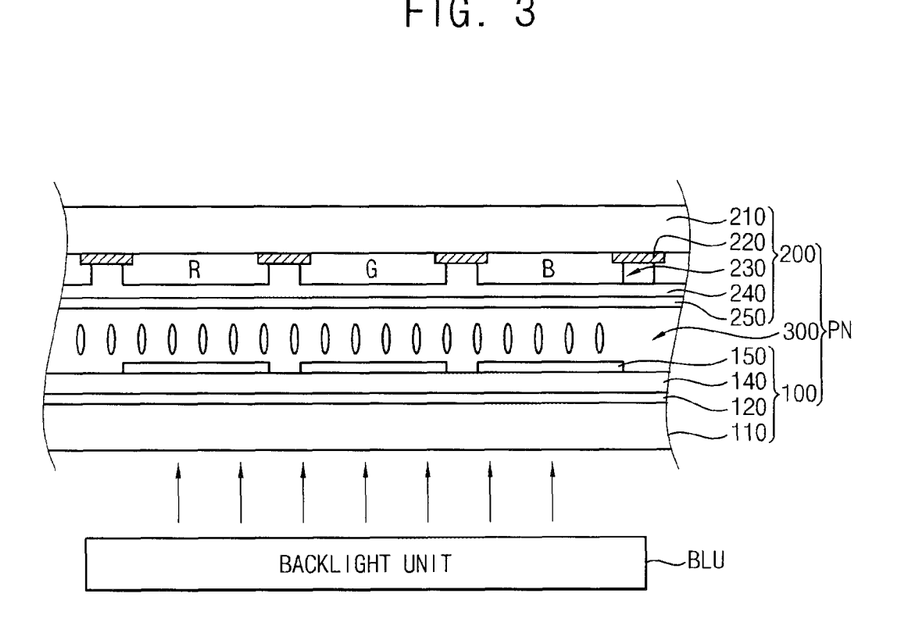
FIG. 3 is a cross-sectional view illustrating a portion of the display device of FIG. 1.
Figure 4:
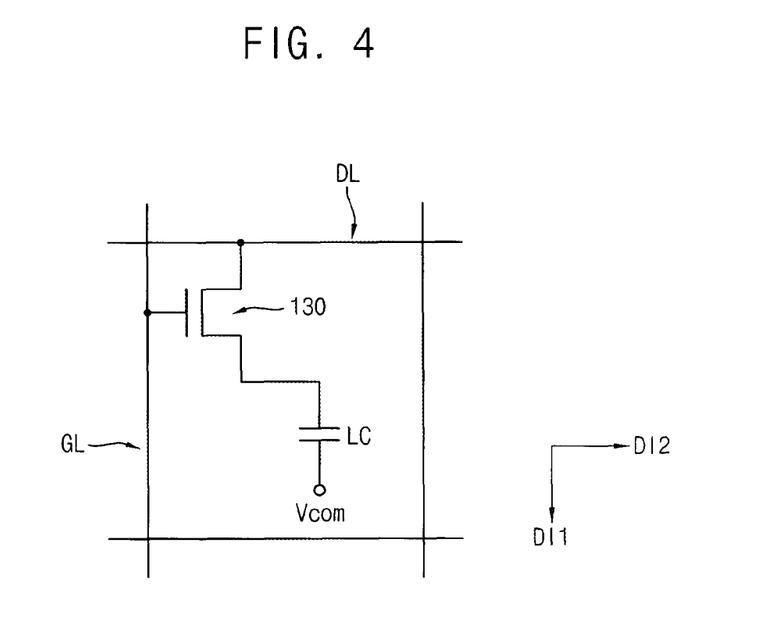
FIG. 4 is a schematic circuit diagram conceptually illustrating a unit pixel of the display panel of FIG. 1.

FIG. 1 is a plan view schematically illustrating an exemplary embodiment of a display device according to the present invention. FIG. 2 is a plan view schematically illustrating areas of a first substrate of the display panel of FIG. 1. FIG. 3 is a cross-sectional view illustrating a portion of the display device of FIG. 1. FIG. 4 is a circuit diagram conceptually illustrating a unit pixel of the display panel of FIG. 1.

Referring to FIGS. 1 to 4, the display device may include a display panel PN displaying an image, a controller board 800 for controlling the display panel PN, a first flexible circuit film 410, a second flexible circuit film 510, a third flexible circuit film 610, a fourth flexible circuit film 710, and a backlight unit BLU disposed below the display panel PN to provide the display panel PN with light. The first to fourth flexible circuit film 410, 510, 610 and 710 connect to the display panel PN and the controller board 800. As the first to fourth flexible circuit films 410, 510, 610 and 710 are bendable or flexible, the controller board 800 may be disposed below the backlight unit BLU.

The controller board 800 may include a timing controller 810. The timing controller 810 converts an image signal applied from an external device (not shown) into an image control signal for controlling the display panel PN.

The display panel PN may include a first substrate 100, a second substrate 200 facing the first substrate 100 and a liquid crystal layer 300 interposed between the first substrate 100 and the second substrate 200.

The first substrate 100 may include a base substrate 110, a gate line portion GL, a gate insulation layer 120, a data line portion DL, a plurality of thin-film transistors (TFTs) 130, a protective layer 140 and a plurality of pixel electrodes 150.

The gate line portion GL may include a plurality of gate lines formed on the base substrate 110 to be extended along a first direction DI1. The gate insulation layer 120 may be formed on the base substrate 110 to cover the gate line portion GL. The data line portion DL may be formed on the gate insulation layer 120 to have a plurality of data lines being extended in a second direction DI2 crossing the first direction DI1. The first and second directions DI1 and DI2 may be substantially perpendicular to each other.

Each of the TFTs 130 may be connected to one of the gate lines to receive a gate signal, and may be connected to one of the data lines to receive a data signal. The protective layer 140 may be formed on the gate insulation layer 120 to cover the data line DL and the TFTs 130. The pixel electrodes 150 may be formed on the protective layer 140 in a matrix shape, and may be electrically connected to the TFTs 130 through a contact hole formed through the protective layer 140. In this embodiment, a TFT 130 and a pixel electrode 150 formed on a unit pixel area may define a pixel part.

The second substrate 200 may include an opposite base substrate 210, a light-blocking pattern 220, a plurality of color filters 230, an organic insulation layer 240 and a common electrode 250. The opposite base substrate 210 may be disposed to face the base substrate 110 of the first substrate 100. The light-blocking pattern 220 may be formed on the opposite base substrate 210 to cover the gate line portion GL, the data line portion DL and the TFTs 130. The color filters 230 may be formed on the opposite base substrate 210 so as to correspond to the pixel electrodes 150. The color filters 230 may include red color filters R, green color filters G and blue color filters B. The organic insulation layer 240 may cover the light-blocking pattern 220 and the color filters 230 to planarize a surface of the light-blocking pattern 220 and the color filters 230. The common electrode 250 may be formed on the organic insulation layer 240 to receive a common voltage Vcom from an external device (not shown).

The arrangement of liquid crystals in the liquid crystal layer 300 is altered by an electric field formed between the pixel electrodes 150 and the common electrode 250, and thus the transmissivity of light through the liquid crystal layer 300 is changed.

Hereinafter, elements of the first substrate 100 will be described in further detail.

The base substrate 110 may include a display area displaying an image and a peripheral area surrounding the display area. In this embodiment, the display area has a circular shape, and the peripheral area has a ring shape surrounding peripheral portions of the display area.

The display area is divided into four areas by first and second lines that are substantially perpendicular to each other. That is, the display area may include a first divided display area DA1, a second divided display area DA2, a third divided display area DA3 and a fourth divided display area DA4 that are sequentially disposed along a clockwise direction. In an exemplary embodiment, the first to fourth divided display areas DA1, DA2, DA3 and DA4 may have substantially the same size.

The peripheral area may include a first peripheral area PEA1, a second peripheral area PEA2, a third peripheral area PEA3 and a fourth peripheral area PEA4 formed at peripheral portions of the first to fourth divided display areas DA1, DA2, DA3 and DA4, respectively. All of the first and fourth peripheral areas PEA1, PEA2, PEA3 and PEA4 may be extended along the peripheral portions of the display area. In an embodiment, the first to fourth peripheral areas PEA1, PEA2, PEA3 and PEA4 may have substantially the same size.

The peripheral area may further include a first protruding area PA1 extended from the first peripheral area PEA1 in the outward direction thereof, a second protruding area PA2 extended from the second peripheral area PEA2 in the outward direction thereof, a third protruding area PA3 extended from the third peripheral area PEA3 in the outward direction thereof, and a fourth protruding area PA4 extended from the fourth peripheral area PEA4 in the outward direction thereof. In an embodiment, the first protruding area PA1 is disposed adjacent to the fourth peripheral area PEA4, the second protruding area PA2 is disposed adjacent to the first peripheral area PEA1, the third protruding area PA3 is disposed adjacent to the second peripheral area PEA2, and the fourth protruding area PA4 is disposed adjacent to the third peripheral area PEA3. The first to fourth protruding areas PA1, PA2, PA3 and PA4 may have substantially the same shape, and may have substantially the same size.

Referring to FIG. 1, the gate line portion GL may include a plurality of first gate lines GL1 and a plurality of second gate lines GL2. The first gate lines GL1 may be formed on the first and second divided display areas DA1 and DA2 substantially parallel with the first direction DI1, and may be extended on the first peripheral area PEA1. The second gate lines GL2 be formed on the third and fourth divided display areas DA3 and DA4 substantially parallel with the first direction DI1, and may be extended on the third peripheral area PEA3.

In an embodiment, the first gate lines GL1 may include a plurality of first gate main lines GL1-a and a plurality of first gate peripheral lines GL1-b. The first gate main lines GL1-a are formed on the first and second divided display areas DA1 and DA2 substantially parallel with the first direction DI1. The first gate peripheral lines GL1-b are formed on the first peripheral area PEA1 to be connected to a terminal of the first gate main lines GL1-a, respectively. Here, the first gate peripheral lines GL1-b may be formed along a length direction of the first peripheral area PEA1, and may be further extended outwardly on the first protruding area PA1.

The second gate lines GL2 may include a plurality of second gate main lines GL2-a and a plurality of second gate peripheral lines GL2-b. The second gate main lines GL2-a are formed on the third and fourth divided display areas DA3 and DA4 substantially parallel with the first direction DI1. The second gate peripheral lines GL2-b are formed on the third peripheral area PEA3 to be connected to a terminal of the second gate main lines GL2-a, respectively. The second gate peripheral lines GL2-b may be formed along a length direction of the third peripheral area PEA3, and may be further extended outwardly on the third protruding area PA3.

The data line portion DL may include a plurality of first data lines DL1 and a plurality of second data lines DL2. The first data lines DL1 may be formed on the fourth and first divided display areas DA4 and DA1 substantially parallel with the second direction DI2, and may be extended on the fourth peripheral area PEA4. The second data lines DL2 may be formed on the second and third divided display areas DA2 and DA3 substantially parallel with the second direction DI2, and may be extended on the second peripheral area PEA2.

In an embodiment, the first data lines DL1 may include a plurality of first data main lines DL1-a and a plurality of first data peripheral lines DL1-b. The first data main lines DL1-a are formed on the first and fourth divided display areas DA1 and DA4 substantially parallel with the second direction DI2. The first data peripheral lines DL1-b are formed on the fourth peripheral area PEA4 to be connected to a terminal of the first data main lines DL1-a respectively. The first data peripheral lines DL1-b may be formed along a length direction of the fourth peripheral area PEA4, and may be further extended outwardly on the fourth protruding area PA4.

The second data lines DL2 may include a plurality of second data main lines DL2-a and a plurality of second data peripheral lines DL2-b. The second data main lines are formed on the second and third divided display areas DA2 and DA3 substantially parallel with the second direction DI2. The second data peripheral lines DL2-b are formed on the second peripheral area PEA2 to be connected to a terminal of the second data main lines DL2-a, respectively. The second data peripheral lines DL2-b may be formed along a length direc-tion of the second peripheral area PEA2, and may be further extended outwardly on the second protruding area PA2.

In this embodiment, the first gate peripheral lines GL1-b, the second gate peripheral lines GL2-b, the first data peripheral lines DL1-b and the second data peripheral lines DL2-b are extended in a direction identical to a clockwise direction or a counterclockwise direction.

The first flexible circuit film 410 is attached on the first protruding area PA1 to be electrically connected to the first gate peripheral lines GL1-b. In an embodiment, the first flexible circuit film 410 may be electrically connected to the first gate peripheral lines GL1-b by first gate pad parts (not shown) and a first anisotropic conductive film (not shown) formed on a terminal of the first gate peripheral lines GL1-b.

The second flexible circuit film 510 is attached on the third protruding area PA3 to be electrically connected to the second gate peripheral lines GL2-b. In an embodiment, the second flexible circuit film 510 may be electrically connected to the second gate peripheral lines GL2-b by second gate pad parts (not shown) and a second anisotropic conductive film (not shown) formed on a terminal of the second gate peripheral lines GL2-b.

The third flexible circuit film 610 is attached on the fourth protruding area PA4 to be electrically connected to the first data peripheral lines DL1-b. In an embodiment, the third flexible circuit film 610 may be electrically connected to the first data peripheral lines DL1-b by first data pad parts (not shown) and a third anisotropic conductive film (not shown) formed on a terminal of the first data peripheral lines DL1-b.

The fourth flexible circuit film 710 is attached on the second protruding area PA2 to be electrically connected to the second data peripheral lines DL2-b. In an embodiment, the fourth flexible circuit film 710 may be electrically connected to the second data peripheral lines DL2-b by second data pad parts (not shown) and a fourth anisotropic conductive film (not shown) formed on a terminal of the second data peripheral lines DL2-b.

The display panel PN may further include a first gate driving part 400, a second gate driving part 500, a first data driving part 600 and a second data driving part 700.

The first gate driving part 400 having a chip form is mounted on the first flexible circuit film 410 to receive the image controlling signal from the controller board 800. The first gate driving part 400 generates first gate signals in response to the image controlling signal, and applies the first gate signals to each of the first gate lines GL1.

The second gate driving part 500 is mounted on the second flexible circuit film 510 in a chip form to receive the image controlling signal from the controller board 800. The second gate driving part 500 generates second gate signals in response to the image controlling signal, and applies the second gate signals to each of the second gate lines GL2.

The first data driving part 600 is mounted on the third flexible circuit film 610 in a chip form to receive the image controlling signal from the controller board 800. The first data driving part 600 generates first data signals in response to the image controlling signal, and applies the first data signals to each of the first data lines DU.

The second data driving part 700 is mounted on the fourth flexible circuit film 710 in a chip form to receive the image controlling signal from the controller board 800. The second data driving part 700 generates second data signals in response to the image controlling signal, and applies to each of the second data lines DL2.

In FIG. 1, the first and second gate driving parts 400 and 500, and the first and second data driving parts 600 and 700 are mounted on the first to fourth flexible circuit films 410, 510, 610 and 710, respectively. In an alternative embodiment, the first and second gate driving parts 400 and 500, and the first and second data driving parts 600 and 700 may be mounted on the first substrate 100. That is, the first gate driving part 400 is mounted on the first protruding area PA1 to be electrically connected to the first gate peripheral lines GL1-b. The second gate driving part 500 is mounted on the third protruding area PA3 to be electrically connected to the second gate peripheral lines GL2-b. The first data driving part 600 is mounted on the fourth protruding area PA4 to be electrically connected to the first data peripheral lines DL1-b. The second data driving part 700 is mounted on the second protruding area PA2 to be electrically connected to the second gate peripheral lines DL2-b.

According to this embodiment, the display area having a circular shape is divided into four areas, that is, the first to fourth divided display areas DA1, DA2, DA3 and DA4. The first to fourth peripheral areas PEA1, PEA2, PEA3 and PEA4 are formed on the peripheral portions of each the first to fourth divided display areas DA1, DA2, DA3 and DA4.

The first gate lines GL1 are formed on the first and second divided display areas DA1 and DA2 and the first peripheral area PEA1 to be driven by the first gate driving part 400. The second gate lines GL2 are formed on the third and fourth divided display areas DA3 and DA4 and the third peripheral area PEA3 to be driven by the second gate driving part 500. The first data lines DL1 are formed on the first and fourth divided display areas DA1 and DA4 and the fourth peripheral area PEA4 to be driven by the first data driving part 600. The second data lines DL2 is formed on the second and third divided display areas DA2 and DA3 and the second peripheral area PEA2 to be driven by the second data driving part 700. As a result, the display panel PN may display an image of a circular shape.

Figure 5:
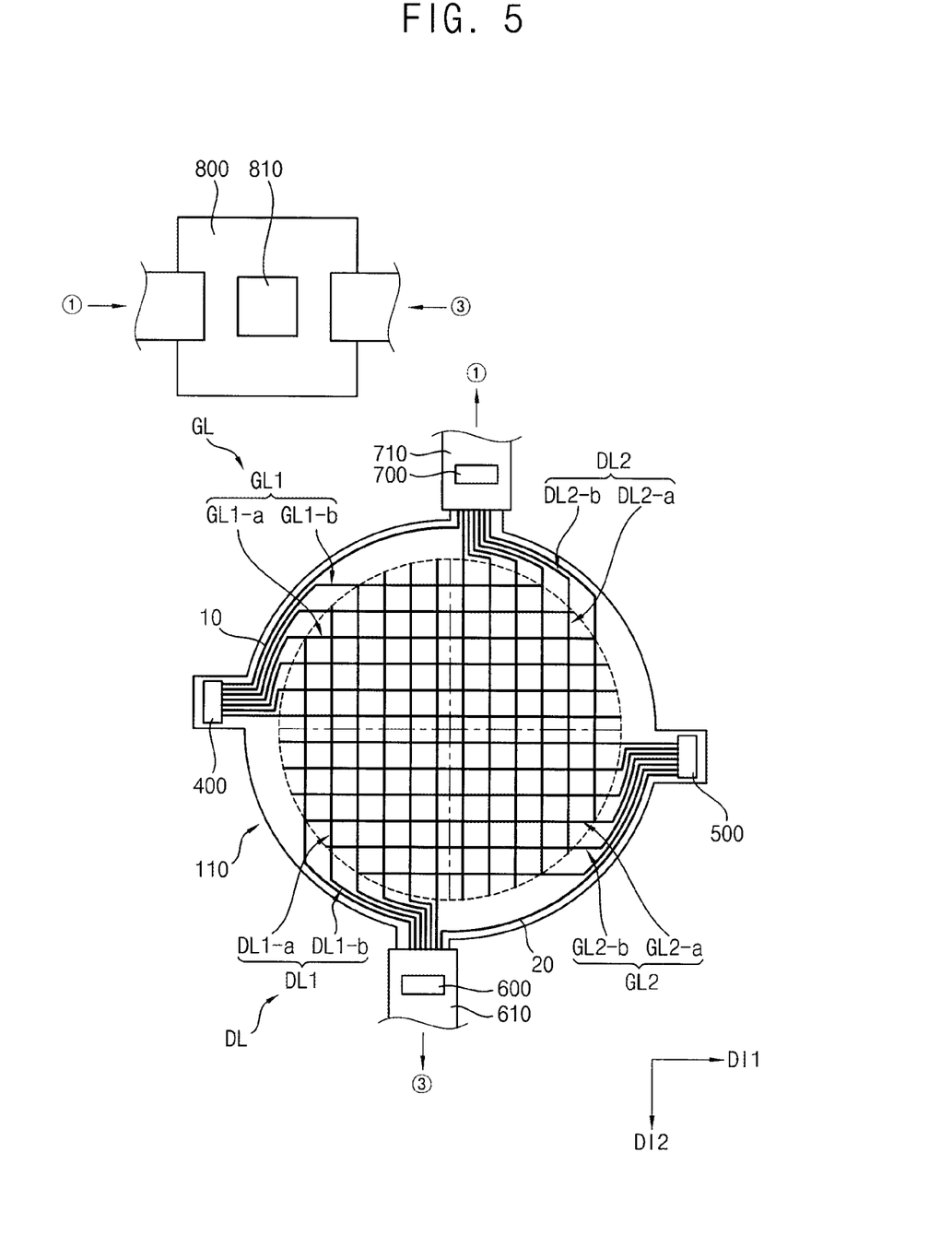
FIG. 5 is a plan view schematically illustrating an exemplary embodiment of a display device according to of the present invention.

FIG. 5 is a plan view schematically illustrating an exemplary embodiment of a display device according to the present invention.

The display device of this embodiment is substantially identical to the previous embodiment of the display device described in connection with FIGS. 1 to 4, except for the omission of the first and second flexible circuit films 410 and 510. Accordingly, the same reference numerals will be used to refer to the same elements as those described, and detailed explanation thereof may be omitted.

Referring to FIG. 5, the first and second gate driving parts 400 and 500 are formed on the base substrate 110 by a process substantially identical to the TFTs 130.

In an embodiment, the first gate driving parts 400 are formed on the first protruding area PA1 to be electrically connected to the first gate peripheral lines GL1-b. The first gate driving parts 400 may include a first driving TFTs (not shown) formed by a process substantially identical to the TFTs 130. The second gate driving parts 500 are formed on the third protruding area PA3 to be electrically connected to the second gate peripheral lines GL2-b. The second gate driving parts 500 may include a second driving TFTs (not shown) formed by a process substantially identical to the TFTs 130.

In an embodiment, the first gate driving part 400 may be electrically connected to the second data driving part 700 by a first gate control line 10 formed on the first peripheral area PEA1. The second gate driving part 500 may be electrically connected to the first data driving part 600 by a second gate control line 20 formed on the third peripheral area PEA3. As a result, the first gate driving part 400 may be driven by the second data driving part 700. The second gate driving part 500 may be driven by the first data driving part 600.

In an alternative embodiment, the first gate driving part 400 may be electrically connected to the first data driving part 700 to be controlled. The second gate driving part 500 may be electrically connected to the second data driving part 600 to be controlled.

In this embodiment, since the first and second gate driving parts 400 and 500 are formed on the base substrate 110, manufacturing costs and the volume of the display device may be reduced.

Figure 6:
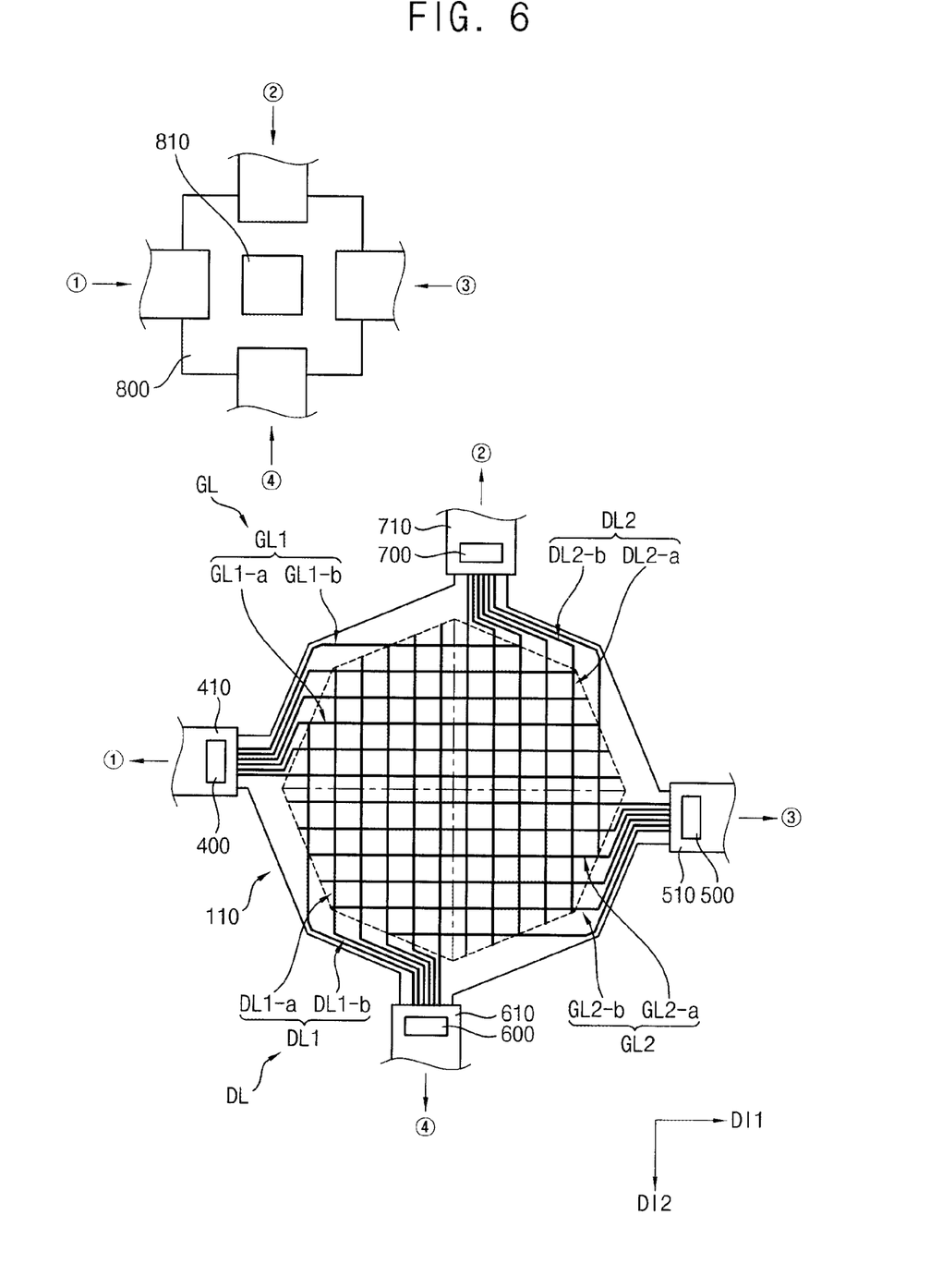
FIG. 6 is a plan view schematically illustrating an exemplary embodiment of a display device according to the present invention.

FIG. 6 is a plan view schematically illustrating an exemplary embodiment of a display device according to the present invention.

The display device in this embodiment is substantially identical to the previous embodiment of the display device described in conjunction with FIGS. 1 to 4, except for the shape of the base substrate 110. Accordingly, the same reference numerals will be used to refer to the same elements as those described, and detailed explanation thereon may be omitted.

Referring to FIG. 6, the base substrate 110 may have various shapes other than a circular shape as shown in FIG. 1. That is, a display area of the base substrate 110 may have various shapes other than a circular shape. In an embodiment, the display area may have a symmetrical shape with respect to the first and second directions DI1 and DI2. In exemplary embodiments, the display area may have an oval shape, a polygonal shape, a star shape, a heart shape, and the like. In an embodiment, a display area may have an octagonal shape as shown in FIG. 6.

All of the first to fourth peripheral areas PEA1, PEA2, PEA3 and PEA4 may be extended along the peripheral portions of the display area.

In this embodiment, as the base substrate 110 may have another shape other than a circular shape, the display panel PN may display an image having various shapes other than a circular shape.

Figure 7:
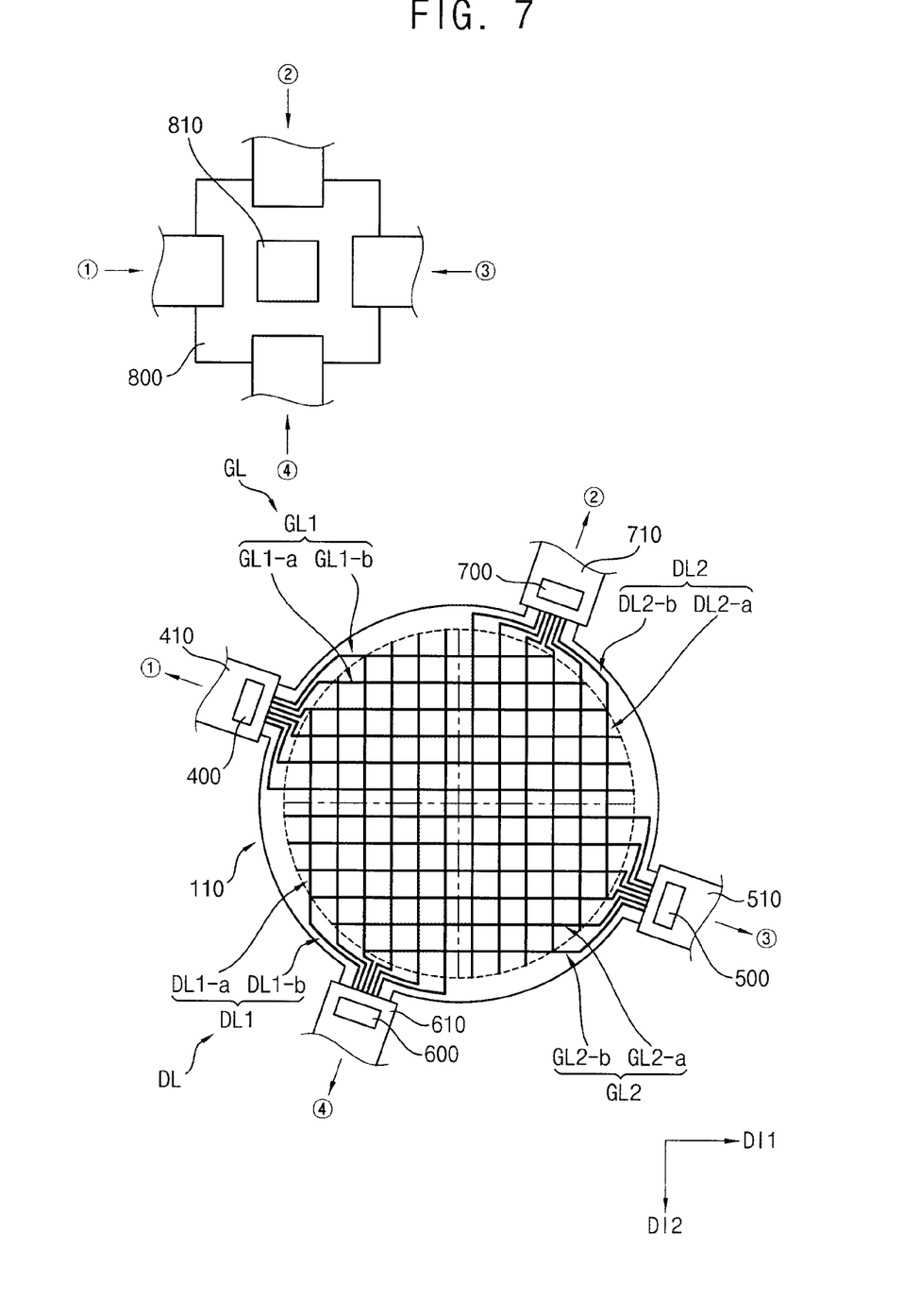
FIG. 7 is a plan view schematically illustrating an exemplary embodiment of a display device according to the present invention.

FIG. 7 is a plan view schematically illustrating an exemplary embodiment of a display device according to the present invention.

The display device in this embodiment is substantially identical to the previous embodiment of the display device described in connection with FIGS. 1 to 4, except for positions of the first to fourth protruding areas PA1, PA2, PA3 and PA4. Accordingly, the same reference numerals will be used to refer to the same elements as those described, and detailed explanation thereon may be omitted.

Referring to FIG. 7, the first protruding area PA1 may be disposed at any position in the first peripheral area PEA1 that are not adjacent to the fourth peripheral area PEA4 and the second peripheral area PEA2. Accordingly, a portion of the first gate peripheral lines GL1-b is extended in a clockwise direction, and the remaining portion of the first gate peripheral lines GL1-b is extended in a counterclockwise direction. In an embodiment, the number of the clockwise first gate peripheral lines GL1-b is equal to that of the counterclockwise first gate peripheral lines GL1-b.

As illustrated in FIG. 7, the first protruding area PA1 is disposed at a middle position of the first peripheral area PEA1 that are not adjacent to the fourth peripheral area PEA4 and the second peripheral area PEA2. That is, the first gate peripheral lines GL1-b is formed on the first protruding area PA1 in a peripheral direction, and is extended along a length direction of the first peripheral area PEA1 in a clockwise direction and a counterclockwise direction with respect to the first protruding area PA1 to be connected to the first gate main lines GL1-a.

Similarly, the third protruding area PA3 may be disposed at any position in the third peripheral area PEA3 that are not adjacent to the second peripheral area PEA2 and the fourth peripheral area PEA4. Accordingly, a portion of the second gate peripheral lines GL2-b is extended in a clockwise direction, and the remaining portion of the second gate peripheral lines GL2-b is extended in a counterclockwise direction. In an embodiment, the number of the clockwise second gate peripheral lines GL2-b is equal to that of the counterclockwise second gate peripheral lines GL2-b.

The third protruding area PA3 is disposed at a middle position of the third peripheral area PEA3 that are not adjacent to the second peripheral area PEA2 and the fourth peripheral area PEA4. That is, the second gate peripheral lines GL2-b is formed on the third protruding area PA3 in a peripheral direction, and is extended along a length direction of the third peripheral area PEA3 in a clockwise direction and a counterclockwise direction with respect to the third protruding area PA3 to be connected to the second gate main lines GL2-a.

The fourth protruding area PA4 may be disposed at any position in the fourth peripheral area PEA4 that are not adjacent to the first peripheral area PEA1 and the third peripheral area PEA3., Accordingly, a portion of the first data peripheral lines DL1-b is extended in a clockwise direction, and the remaining portion of the first data peripheral lines DL1-b is extended in a counterclockwise direction. In an embodiment, the number of the clockwise first data peripheral lines DL1-b is equal to that of the counterclockwise first data peripheral lines DL1-b.

The fourth protruding area PA4 is disposed at a middle position of the fourth peripheral area PEA4 that are not adjacent to the first peripheral area PEA1 and the third peripheral area PEA3. That is, the first data peripheral lines DL1-b is formed on the fourth protruding area PA4 in a peripheral direction, and is extended along a length direction of the fourth peripheral area PEA4 in a clockwise direction and a counterclockwise direction with respect to the fourth protruding area PA4 to be connected to the first data main lines DL1-a.

The second protruding area PA2 may be disposed at any position in the second peripheral area PEA2 that are not adjacent to the first peripheral area PEA1 and the third peripheral area PEA3. Accordingly, a portion of the second data peripheral lines DL2-b is extended in a clockwise direction, and the remaining portion of the second data peripheral lines DL2-b is extended in a counterclockwise direction. In an embodiment, the number of the clockwise second data peripheral lines DL2-b is equal to that of the counterclockwise second gate peripheral lines DL2-b.

That is, the second data peripheral lines DL2-b is formed on the second protruding area PA2 in a peripheral direction, and is extended along a length direction of the second peripheral area PEA2 in a clockwise direction and a counterclockwise direction with respect to the second protruding area PA2 to be connected to the second data main lines DL2-a.

In this embodiment, since the first and second gate peripheral lines GL1-b and GL2-b, and the first and second data peripheral lines DL1-b and DL2-b are extended in a clockwise direction and a counterclockwise direction, the widths of the first to fourth peripheral areas PEA1, PEA2, PEA3 and PEA4 may be reduced.

Figure 8:
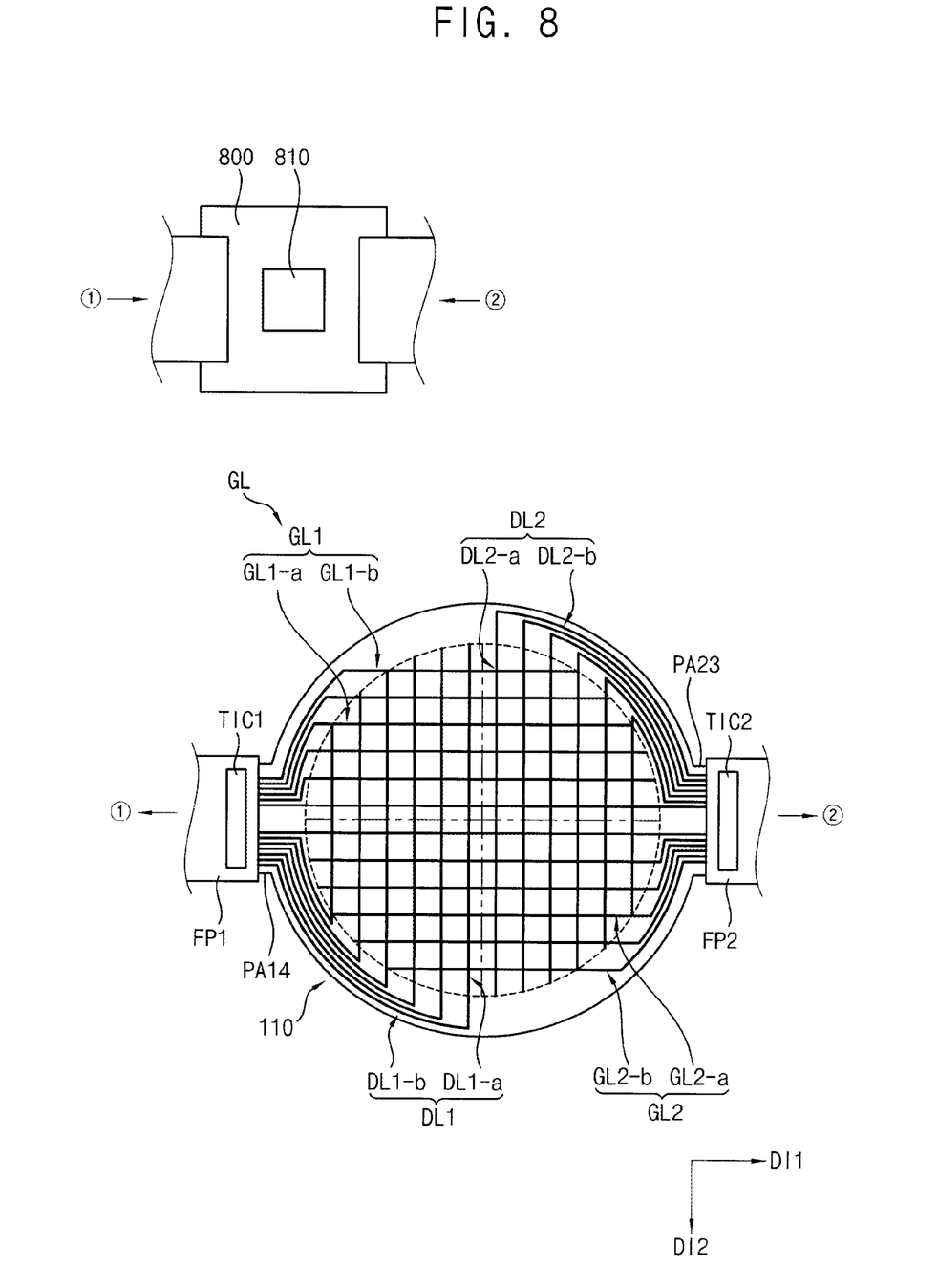
FIG. 8 is a plan view schematically illustrating an exemplary embodiment of a display device according to the present invention.

FIG. 8 is a plan view schematically illustrating an exemplary embodiment of a display device according to the present invention.

The display device in this embodiment is substantially identical to the previous embodiment of the display device described in connection with FIGS. 1 to 4, except for the structure of the protruding areas, and their associated configurations of the gate and data driving parts and the flexible circuit films, and the like. Accordingly, the same reference numerals will be used to refer to the same elements as those described, and detailed explanation thereon may be omitted.

Referring to FIG. 8, the first and fourth protruding areas PA1 and PA4 are integrated into a first integrated protruding area PA14, and the second and third protruding areas PA2 and PA3 are integrated into a second integrated protruding area PA23.

The first gate peripheral lines GL1-b is formed on the first peripheral area PEA1 in a counterclockwise direction with respect to the first integrated protruding area PA14, and is outwardly extended to the first integrated protruding area PA14. The second gate peripheral lines GL2-b is formed on the fourth peripheral area PEA4 in a clockwise direction with respect to the second integrated protruding area PA23, and is outwardly extended to the second integrated protruding area PA23.

A side of the first flexible circuit film FP1 is attached on the first integrated protruding areas PA14 to be electrically connected to the first gate peripheral lines GL1-b and the first data peripheral lines DL1-b. Another side of the first flexible circuit film FP1 is attached on the controller board 800 to be electrically connected. A side of the second flexible circuit film FP2 is attached on the second integrated protruding areas PA23 to be electrically connected to the second gate peripheral lines GL2-b and the second data peripheral lines DL2-b. Another side of the second flexible circuit film FP2 is attached on the controller board 800 to be electrically connected.

The first integrated driving chip TIC1 is mounted on the first flexible circuit film FP1 to receive the image controlling signal from the controller board 800. The first integrated driving chip TIC1 responds to the image controlling signal to generate first gate signals and first data signals. The first gate signals are applied to the first gate peripheral lines GL1-b through the first flexible circuit film FP1, respectively. The first data signals are applied to the first data peripheral lines DL1-b through the first flexible circuit film FP1, respectively. The first integrated driving chip TIC1 is a driving chip integrating the first gate driving part 400 and the first data driving part 600 in the previous embodiment shown in FIGS. 1 to 4.

The second integrated driving chip TIC2 is mounted on the second flexible circuit film FP2 to receive the image controlling signal from the controller board 800. The second integrated driving chip TIC2 responds to the image controlling signal to generate second gate signals and second data signals. The second gate signals are applied to the second gate peripheral lines GL2-b through the second flexible circuit film FP2, respectively. The second data signals are applied to the second data peripheral lines DL2-b through the second flexible circuit film FP2, respectively. The second integrated driving chip TIC2 is a driving chip integrating the second gate driving part 500 and the second data driving part 700 in the previous embodiment of FIGS. 1 to 4.

In this embodiment, the first and second integrated driving chips TIC1 and TIC2 are formed on the first and second flexible circuit films FP1 and FP2, respectively. In an alternative embodiment, the first integrated driving chips TIC1 may be mounted on the first and fourth protruding areas PA1 and PA4 that are integrated to each other to be electrically connected to the first gate peripheral lines GL1-b and the first data peripheral lines DL1-b.

The second integrated driving chips TIC2 may be mounted on the second and third protruding areas PA2 and PA3 that are integrated to each other to be electrically connected to the second gate peripheral lines GL2-b and the second data peripheral lines DL2-b.

Also, in this embodiment, the first and fourth protruding areas PA1 and PA4 are connected to each other to be integrally formed, and the second and third protruding areas PA2 and PA3 are connected to each other to be integrally formed. In an alternative embodiment, the first and second protruding areas PA1 and PA2 may be connected to each other to be integrally formed, and the third and fourth protruding areas PA3 and PA4 may be connected to each other to be integrally formed.

According to this embodiment, the first integrated driving chip TIC1 integrates the first gate driving part 400 and the second data driving part 700, and the second integrated driving chip TIC2 integrates the second gate driving part 500 and the first data driving part 600. Accordingly, manufacturing costs and the volume of the display device may be reduced.

According to the exemplary embodiments of the present invention, a display area displaying an image and a peripheral area surrounding the display area are divided into four areas. Gate lines or the data lines are formed on each area. Accordingly, a first substrate of a display panel may have various shapes other than a rectangle. Thus, the display panel may display an image having various shapes other than a rectangular.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as being limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A display substrate comprising:
a base substrate comprising:
a display area divided into a first divided display area, a second divided display area, a third divided display area and a fourth divided display area sequentially disposed along a clockwise direction; and
a peripheral area disposed at a peripheral portion of the display area;
a gate line portion comprising:
first gate main lines disposed on the first and second divided display areas substantially parallel with a first direction; and
second gate main lines disposed on the third and fourth dividing areas substantially parallel with the first direction;
a data line portion comprising:
first data main lines disposed on the fourth and first divided display areas substantially parallel with a second direction substantially perpendicular to the first direction; and
second data main lines disposed on the second and third divided display areas substantially parallel with the second direction; and
pixel portions disposed in the display area in a matrix pattern, the pixel portions being electrically connected to the first and second gate main lines and the first and second data main lines,
wherein the gate line portion further comprises:
first gate peripheral lines connected to terminals of the first gate main lines, the first gate peripheral lines disposed on the peripheral area; and
second gate peripheral lines connected to terminals of the second gate main lines, the second gate peripheral lines disposed on the peripheral area, wherein the data line portion further comprises:
first data peripheral lines connected to terminals of the first data main lines, the first data peripheral lines disposed on the peripheral area; and
second data peripheral lines connected to terminals of the second data main lines, the second data peripheral lines disposed on the peripheral area,
wherein the base substrate further comprises a protruding area extended outwardly from the peripheral area, and the first and second gate peripheral lines and the first and second data peripheral lines are extended to the protruding area,
wherein a gate driving part and a data driving part are provided in the protruding area, and the first and second gate main lines and the first and second data main lines are electrically connected to the gate driving part and the data driving part respectively,
wherein the gate driving part and a data driving part are integrated into an integrated driving chip provided in the protruding area, and
wherein the integrated driving chip includes a first integrated driving chip and a second integrated driving chip,
wherein the first integrated driving chip is electrically connected to the first gate main lines and the first data main lines through the protruding area, the first integrated driving chip configured to apply the first gate signals to the first gate main lines, and configured to apply the first data signals to the first data main lines; and
the second integrated driving chip electrically connected to the second gate main lines and the second data main lines through the protruding area, the second integrated driving chip configured to apply the second gate signals to the second gate main lines, and configured to apply the second data signals to the second data main lines.

* * * * *